United States Patent
Dai et al.

(10) Patent No.: US 11,799,599 B2
(45) Date of Patent: Oct. 24, 2023

(54) MEASURING RECEPTION QUALITY OF A DIFFERENTIAL MANCHESTER ENCODED SIGNAL

(71) Applicant: Marvell Asia Pte Ltd, Singapore (SG)

(72) Inventors: Shaoan Dai, San Jose, CA (US); Xing Wu, Palo Alto, CA (US); Wensheng Sun, San Jose, CA (US); Liang Zhu, Shanghai (CN)

(73) Assignee: MARVELL ASIA PTE LTD, Singapore (SG)

( * ) Notice: Subject to any disclaimer, the term of this patent is extended or adjusted under 35 U.S.C. 154(b) by 0 days.

(21) Appl. No.: 17/676,158

(22) Filed: Feb. 20, 2022

(65) Prior Publication Data
US 2022/0271877 A1  Aug. 25, 2022

Related U.S. Application Data

(60) Provisional application No. 63/153,826, filed on Feb. 25, 2021.

(51) Int. Cl.
*H04L 1/20* (2006.01)
*H03M 7/36* (2006.01)
*H04L 1/00* (2006.01)

(52) U.S. Cl.
CPC .......... *H04L 1/206* (2013.01); *H03M 7/3044* (2013.01); *H04L 1/0036* (2013.01)

(58) Field of Classification Search
CPC .... H04L 1/206; H04L 1/0036; H03M 7/3044; H04B 3/46; H04B 17/309
USPC .................................................. 375/224, 361
See application file for complete search history.

(56) References Cited

U.S. PATENT DOCUMENTS

| | | | |
|---|---|---|---|
| 2001/0038674 A1* | 11/2001 | Trans | H04L 1/20 370/503 |
| 2003/0128451 A1* | 7/2003 | Ohta | G11B 20/10037 |
| 2004/0179588 A1* | 9/2004 | Kuffner | G06K 7/10039 375/224 |
| 2021/0055980 A1* | 2/2021 | Chen | G06F 11/322 |

OTHER PUBLICATIONS

Dai et al., U.S. Appl. No. 17/677,865, filed Feb. 22, 2022.
Zimmerman et al., "IEEE P802.3cg 10Mb/s Single Pair Ethernet: A Guide," Tutorial, Single Pair Ethernet Task Force, pp. 1-40, Jan. 2018.

(Continued)

*Primary Examiner* — Don N Vo

(57) ABSTRACT

A receiver includes an interface and a processor. The interface is configured to receive a signal including symbols carrying bit values in respective symbol intervals, and to convert the received signal into a serial sequence of digital samples, the received signal being modulated using a Differential Manchester Encoding (DME) scheme that (i) represents a first bit value by a first symbol type having a level transition in the corresponding symbol interval and (ii) represents a second bit value by a second symbol type having a constant level in the corresponding symbol interval. The processor is configured to derive an error signal from the digital samples, and to produce a quality measure of the received signal based on the derived error signal.

17 Claims, 4 Drawing Sheets

(56) References Cited

OTHER PUBLICATIONS

"IEEE 802.3cg-2019—IEEE Standard for Ethernet—Amendment 5: Physical Layers Specifications and Management Parameters for 10 Mb/s Operation and Associated Power Delivery over a Single Balanced Pair of Conductors," IEEE Computer Society, pp. 1-256, Feb. 5, 2020.

"IEEE P802.3da/Do.6—Draft Standard for Ethernet—Amendment: Physical Layer Specifications and Management Parameters for Enhancement of 10 Mb/s Operation over Single Balanced Pair Multidrop Segments," IEEE Computer Society, pp. 1-74, Sep. 24, 2021.

* cited by examiner

MEASURING RECEPTION QUALITY OF A DIFFERENTIAL MANCHESTER ENCODED SIGNAL

CROSS-REFERENCE TO RELATED APPLICATIONS

This application claims the benefit of U.S. Provisional Patent Application 63/153,826, filed Feb. 25, 2021, whose disclosure is incorporated herein by reference.

FIELD OF THE DISCLOSURE

The present disclosure relates generally to communication systems, and particularly to methods and systems for measuring the reception quality of signals modulated using a Differential Manchester Encoding (DME) scheme.

BACKGROUND

Various applications require communication over short distances, such as automotive in-car networks, Internet of Things (IoT) and Machine to Machine (M2M). Several types of protocols and communication media have been proposed for such applications. For example, Ethernet communication over twisted-pair copper wire media is specified in "IEEE 802.3cg-2019—IEEE Standard for Ethernet—Amendment 5: Physical Layer Specifications and Management Parameters for 10 Mb/s Operation and Associated Power Delivery over a Single Balanced Pair of Conductors," published Feb. 5, 2020. A variant for short reach that is specified under the IEEE 802.3cg-2019 standard is called 10BASE-T1S, which offers a bandwidth of 10 Mbit/s over a single pair physical layer.

The description above is presented as a general overview of related art in this field and should not be construed as an admission that any of the information it contains constitutes prior art against the present patent application.

SUMMARY

An embodiment that is described herein provides a receiver that includes an interface and a processor. The interface is configured to receive a signal including symbols carrying bit values in respective symbol intervals, and to convert the received signal into a serial sequence of digital samples, the received signal being modulated using a Differential Manchester Encoding (DME) scheme that (i) represents a first bit value by a first symbol type having a level transition in the corresponding symbol interval and (ii) represents a second bit value by a second symbol type having a constant level in the corresponding symbol interval. The processor is configured to derive an error signal from the digital samples, and to produce a quality measure of the received signal based on the derived error signal.

In some embodiments, the processor is configured to derive the error signal by filtering the digital samples by a first matching filter that is matched to the first symbol type and calculating absolute values of samples output by the first matching filter so as to produce a first absolute-value filtered signal, filtering the digital samples by a second matching filter that is matched to the second symbol type and calculating absolute values of samples output by the second matching filter so as to produce a second absolute-value filtered signal, and producing the error signal based on a difference signal calculated according to a difference between the first absolute-value filtered signal and the second absolute-value filtered signal. In other embodiments, the processor is configured to calculate the error signal for a given symbol interval by calculating a difference between a value of the difference signal for the given symbol interval and a maximal or minimal achievable value of the difference signal. In yet other embodiments, the interface is configured to receive the signal over a single-pair link in accordance with a 10BASE-T1S specification.

In an embodiment, the interface is configured to receive the signal from an automotive communication network. In another embodiment, the processor is configured to calculate an absolute-value error signal from the error signal, to filter the absolute-value error signal for producing a filtered absolute-value error signal using a smoothing filter, and to convert the filtered absolute-value error signal into the quality measure. In yet another embodiment, the processor is configured to convert the filtered absolute-value error signal into the quality measure using a lookup table.

In some embodiments, the quality measure is an average quality measure, and the processor is configured to filter the absolute-value error signal using a Low Pass Filter (LPF). In other embodiments, the quality measure is a peak quality measure, and the processor is configured to filter the absolute-value error signal by selecting peak values of the absolute-value error signal and averaging among the selected peak values.

There is additionally provided, in accordance with an embodiment that is described herein, a method for communication, including receiving a signal including symbols carrying bit values in respective symbol intervals, and converting the received signal into a serial sequence of digital samples, the received signal being modulated using a Differential Manchester Encoding (DME) scheme that (i) represents a first bit value by a first symbol type having a level transition in the corresponding symbol interval and (ii) represents a second bit value by a second symbol type having a constant level in the corresponding symbol interval. An error signal is derived from the digital samples. A quality measure of the received signal is produced based on the derived error signal.

The present disclosure will be more fully understood from the following detailed description of the embodiments thereof, taken together with the drawings in which:

DETAILED DESCRIPTION OF EMBODIMENTS

Figure 1:
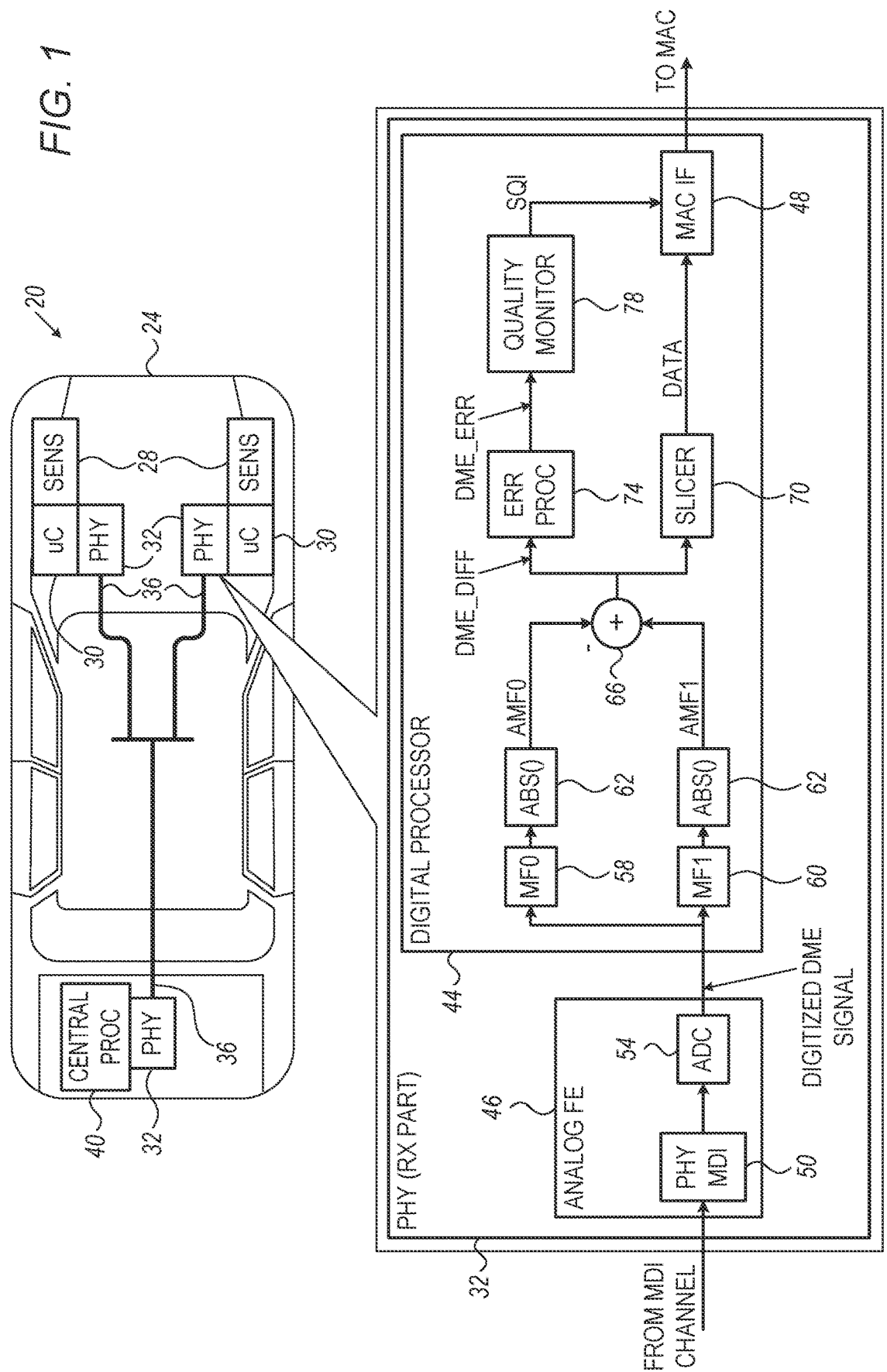
FIG. 1 is a block diagram that schematically illustrates an automotive communication system, in accordance with an embodiment that is described herein.

Embodiments that are described herein provide methods and systems for measuring the reception quality of a signal modulated using a Differential Manchester Encoding (DME) scheme. The embodiments described herein are described in the context of automotive applications, e.g., systems that collect data from sensors within a vehicle. The choice to describe a single embodiment, however, is made solely for the sake of clarity. The disclosed techniques are equally applicable in other applications, for example in industrial and/or smart-home networks.

In DME, a '1' bit value is represented by a first symbol type denoted herein DME1 and a '0' bit value is represented by a second symbol type, different from the first signal type, denoted herein DME0. In the embodiments that will be described below, a DME1 symbol has a level transition in the corresponding symbol interval, and a DME0 symbol has a constant level in the corresponding symbol interval. In other embodiments, however, the roles of DME0 and DME1 may be switched. To send a sequence of data bits to a receiver, the transmitter transmits a sequence of corresponding DME0 and DME1 symbols.

At the receiver side, the DME signal is sampled and digitized to produce a digital DME signal. The digital DME signal is filtered using matching filters denoted MF0 and MF1 that are respectively matched to the DME0 and DME1 symbols. Based on the outputs of the two matching filters, the receiver recovers the data bits carried in the DME signal.

In a practical communication system, the received DME signal may be degraded by various sources. For example, the channel between the transmitter and the receiver is typically imperfect and may distort the signal and/or make the signal noisy. The DME signal may also be subjected to interference such as Electromagnetic Interference (EMI). Another cause for degradation in the reception quality is inaccurate sampling instances at the receiver side. The degradation in reception quality may result in communication errors, wherein the probability of error typically increases with the level of degradation.

An example communication system that may communicate DME signals is a Vehicle Ethernet network, which typically is required to deliver large amounts of data at high-speeds and low latencies, under extreme environmental conditions. On the other hand, in-vehicle communication needs to be highly reliable, e.g., for safety reasons.

In some applications, the receiver may monitor and report the reception quality. A quality measure referred to as a Signal Quality Index (SQI), is specified, for example, by the 14th Tech Committee (TC14) of the One-Pair Ether-Net (OPEN) Alliance Inc.

Consider an embodiment of a receiver comprising an interface and a processor. The interface is configured to receive a signal being modulated using a DME scheme, and to convert the received signal into a serial sequence of digital samples. The processor is configured to derive an error signal from the digital samples, and to produce a quality measure of the received signal based on the derived error signal.

The processor may derive the error signal in various ways. In one embodiment, the processor derives the error signal by (i) filtering the digital samples by a first matching filter that is matched to the first symbol type and calculating absolute values of samples output by the first matching filter so as to produce a first absolute-value filtered signal, (ii) further filtering the digital samples by a second matching filter that is matched to the second bit value symbol type and calculating absolute values of samples output by the first matching filter so as to produce a second absolute-value filtered signal, and (iii) producing the error signal based on a difference signal calculated according to a difference between the first absolute-value filtered signal and the second absolute-value filtered signal.

In some embodiments, the quality measure is relative to a maximal quality that would be achieved under optimal conditions. In such embodiments, the processor is configured to calculate the error signal for a given symbol interval by calculating a difference between a value of the difference signal for the given symbol interval and a maximal or minimal achievable value of the difference signal.

In some embodiments, to produce the quality measure, the processor is configured to calculate an absolute-value error signal from the error signal, to filter the absolute-value error signal for producing a filtered absolute-value error signal using a smoothing filter, and to convert the filtered absolute-value error signal into the quality measure, e.g., using a lookup table.

In some embodiments, the quality measure is an average quality measure, and the processor filters the absolute-value error signal using a Low Pass Filter (LPF). In other embodiments, the quality measure is a peak quality measure, and the processor selects multiple peak values of the absolute-value error signal, and averages among the selected peak values.

In the disclosed techniques, an error signal is produced for a DME signal and used for monitoring the reception quality of the DME signal. The reception quality is measured relative to a maximal quality that would be achievable under optimal conditions. Among other applications, the disclosed quality measure may be applicable for a DME signal specified in the 10BASE-T1S specification.

FIG. 1 is a block diagram that schematically illustrates an automotive communication system 20, in accordance with an embodiment that is described herein. Communication system 20 is installed in a vehicle 24, and comprises multiple sensors 28, multiple microcontrollers 30, and multiple Ethernet physical layer (PHY) devices 32 (also referred to as Ethernet transceivers). The PHY devices 32 are interconnected by an Ethernet network configured in a multidrop topology. The PHY devices connect to the Ethernet network using links 36.

In various embodiments, sensors 28 may comprise any suitable types of sensors. Several non-limiting examples of sensors comprise video cameras, velocity sensors, accelerometers, audio sensors, infra-red sensors, radar sensors, lidar sensors, ultrasonic sensors, rangefinders or other proximity sensors, and the like.

PHY devices 32 typically operate at least partially in accordance with one or more of the IEEE 802.3 Ethernet standards, e.g., the 10BASE-TIS standard. Although the techniques described herein pertain mainly to the physical layer, PHY devices 32 may also perform Medium Access Control (MAC) functions as well, in an embodiment.

Depending on the applicable Ethernet standard, links 36 may comprise any suitable physical medium. In the embodiments described herein, although not necessarily, each link 36 comprises a single pair of wires, e.g., a single twisted-pair link that is optionally shielded. In alternative embodiments, links 36 may comprise single-ended wire links, not necessarily Ethernet compliant.

In the present example, each sensor 28 is connected to a respective microcontroller 30, which is in turn connected to a respective PHY device 32. The PHY device 32 of each sensor is connected by a link 36 to peer PHY devices 32 coupled to the Ethernet network. On the sensor side of a given link, microcontroller 30 serves as a Medium Access Control (MAC) controller. Microcontrollers 30 are thus also referred to herein as MAC devices, hosts or Systems-on-Chip (SoC). In some embodiments, the PHY circuitry and the circuitry that performs MAC functions (e.g., microcontroller) are integrated in the same device. In the present example, a central processor 40 (on the right-hand side of the figure) is connected via the Ethernet network but is not connected directly to any sensor. Alternatively or additionally, central processor 40 may connect directly to one or more sensors (or to microcontrollers 30 of the sensors), in an embodiment.

The PHY devices 32, and links 36 form an Ethernet network within vehicle 24. Using this vehicle Ethernet network, central processor 40 sends control messages to sensors 28, and receives information captured by the sensors. The multidrop topology of the Ethernet network depicted in FIG. 1 is given by way of example, and other suitable topologies can also be used, e.g., topologies that include one or more switches and/or more than a single central processor 40.

An inset at the bottom of FIG. 1 shows the internal structure of a PHY device 32, in an embodiment. The inset depicts only the receiver part of the PHY device and omits the transmitter part, for the sake of clarity. PHY device 32 comprises a digital processor 44 and an analog Front End (FE) 46. In an embodiment, digital processor 44 comprises a MAC interface (IF) 48, which is configured to communicate with a MAC device, e.g., of sensor 28, or central processor 40. Analog FE 46 comprises a PHY Media-Dependent Interface (MDI) 50, which is configured to transmit and receive analog Ethernet signals over an MDI channel comprising a physical link 36 (e.g., a twisted-pair link).

Analog FE 46 receives, via MDI 50, an analog Ethernet signal carrying data. The analog Ethernet signal is processed by analog FE 46 followed by digital processor 44 that recovers the data. The digital processor delivers the recovered data to a peer MAC device via MAC interface 48. Digital processor 44 is also referred to simply as a "processor" for brevity.

In the present example, PHY MDI 50 receives from the Ethernet network an analog signal modulated using a DME scheme. An Analog to Digital Converter (ADC) 54 samples the received analog signal and converts it into a digital DME signal comprising a sequence of digital samples. In an embodiment, the sampling rate of the ADC is higher than the rate of the DME symbols, e.g., by a factor of 5 or even 10.

Processor 44 filters the samples of the DME signal using (i) a matching filter MF0 (58) that is matched to the DME0 symbol of a '0' valued bit, and (ii) a matching filter MF1 (60) that is matched to the DME1 symbol of a '1' valued bit. The processor calculates absolute values of the samples output by MF0 and MF1, using absolute value modules 62, so as to produce absolute-value filtered signals denoted AMF0 and AMF1, respectively. A subtractor 66 produces a difference signal denoted DME_DIFF by subtracting the samples of the AMF0 signal from corresponding samples of the AMF1 signal. Example DME signals and corresponding matching filters will be described below with reference to FIG. 3.

At the symbol sampling instance, the AMF0 signal corresponding to MF0 typically has a high value for a DME0 symbol and a low value for a DME1 symbol. Similarly, at the symbol sampling instance, the AMF1 signal corresponding to MF1 has a high value for a DME1 symbol and a low value for a DME0 symbol. In an embodiment, a slicer 70 checks the difference signal DME_DIFF at the symbol sampling instances to decide on the corresponding bit values. The slicer provides the recovered data bits to MAC interface 48.

The DME_DIFF signal serves also for monitoring the quality of the received DME signal, in an embodiment. To this end, an error processor 74 derives from the DME_DIFF signal an error signal denoted DME_ERR. In some embodiments, the DME_ERR signal is indicative of the reception quality of the DME signal relative to ideal reception conditions. In ideal conditions, the DME signal produced at the transmitter arrives undistorted at the receiver, and is sampled at the symbol instances.

A quality monitor 78 produces from the DME_ERR signal a quality measure signal that is indicative of the quality of the received DME signal. The quality measure signal may comprise, for example, a Signal Quality Index (SQI). Providing a SQI is a requirement specified, for example, by the 14$^{th}$ Tech Committee (TC14) of the One-Pair Ether-Net (OPEN) Alliance Inc.

Figure 2:
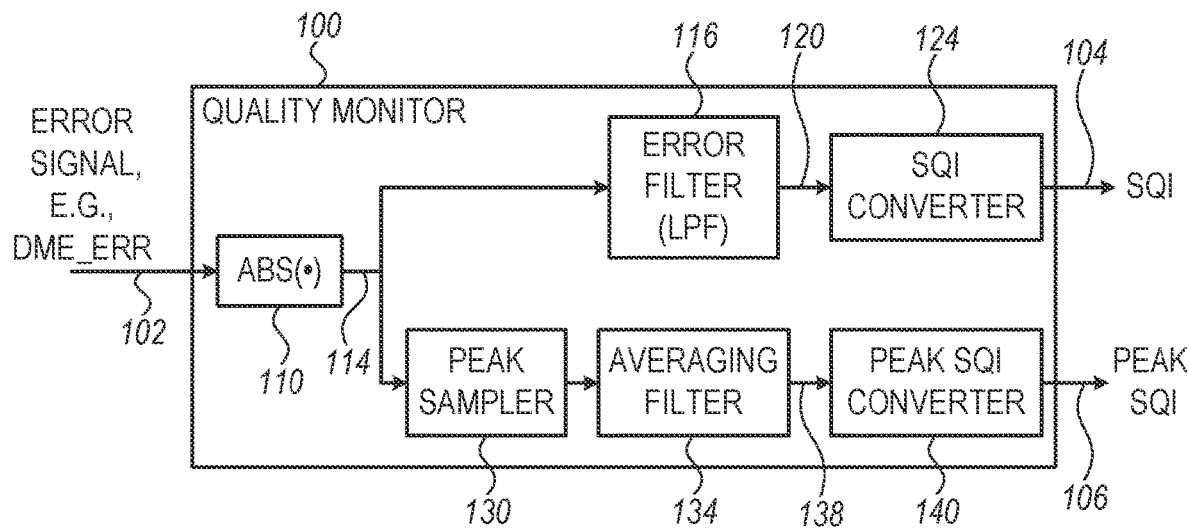
FIG. 2 is a block diagram that schematically illustrates a PHY device that measures reception quality of a DME signal, in accordance with an embodiment that is described herein.

FIG. 2 is a block diagram that schematically illustrates a quality monitor 100 for a DME signal, in accordance with an embodiment that is described herein. Quality monitor 100 may be used in implementing quality monitor 78 of FIG. 1.

In the example of FIG. 2, quality monitor 100 processes a received error signal 102 to produce quality measure outputs denoted Signal Quality Index (SQI) 104 and a peak SQI 106. In the present example, it is assumed that input error signal 102 comprises the DME_ERR signal produced by error processor 74 of FIG. 1. Alternatively, other suitable types of error signals can also be used.

An absolute value module 110 calculates from the error signal (DME_ERR) an absolute-value error signal 114 comprising absolute values of corresponding samples of the error signal. Producing a quality measure is based on smoothing the absolute-value error signal and converting the smoothed absolute-value error signal into quality measurements.

In the upper processing branch, an error filter 116, e.g., a smoothing filter such as a Low Pass Filter (LPF), filters the absolute-value error signal 114 to produce a smoothed absolute-value error signal 120. A SQI converter 124 converts the smoothed absolute-value error signal 120 into SQI signal 104. In an embodiment, the SQI converter is implemented using a predefined lookup table. SQI 104 may be considered as an average quality measure because it is not limited to any selected attribute of the samples of the absolute-value error signal.

In the lower processing branch, a peak sampler 130 selects samples of absolute-value error signal 114 having peak values. In an example embodiment, the peak sampler selects a peak sample having a maximal value among multiple samples of the absolute-value error signal 114. Alternatively, other suitable selection methods of the peak samples may also be used. An averaging filter 134 filters the selected peak samples to produce a smoothed error peak signal 138. In an embodiment, filter 134 averages among multiple peak samples.

A peak SQI converter 140 converts the smoothed peak error signal 138 into peak SQI signal 106. In an embodiment, the peak SQI converter is implemented using a predefined lookup table. The peak SQI measurement may be considered as a peak quality measure.

The configurations of communication system 20 and its components, such the internal structure of PHY devices 32, as shown in FIGS. 1 and 2, are example configurations that are depicted solely for the sake of clarity. In alternative embodiments, any other suitable configurations can be used. For example, the disclosed techniques can be used in any other suitable network or link topology, e.g., a topology that includes one or more switches. As another example, the disclosed techniques can be used in a point-to-point Ethernet link between two PHY devices or switches. Elements that are not mandatory for understanding of the disclosed techniques have been omitted from the figure for the sake of clarity.

In the example PHY configuration shown in FIG. 1, Analog FE 46 and digital processor 44 are implemented as separate Integrated Circuits (ICs). In alternative embodiments, however, the analog FE and digital processor may be integrated on separate semiconductor dies in a single Multi-Chip Package (MCP) or System on Chip (SoC and may be interconnected by an internal bus.

The different elements of communication system 20 and its various components may be implemented using dedicated hardware or firmware, such as using hard-wired or programmable logic, e.g., in an Application-Specific Integrated Circuit (ASIC) or Field-Programmable Gate Array (FPGA). Additionally or alternatively, some functions, e.g., functions of digital processor 44 such as MF0 58, MF1 60, subtractor 66, slicer 70, MAC IF 48, error processor 74 and quality monitor 78 (and 100) may be implemented in software and/or using a combination of hardware and software elements.

In some embodiments, digital processor 44 comprises a programmable processor, e.g., a Digital Signal Processor (DSP) or other suitable processor, which is programmed in software to carry out the functions described herein. The software may be downloaded to any of the processors in electronic form, over a network, for example, or it may, alternatively or additionally, be provided and/or stored on non-transitory tangible media, such as magnetic, optical, or electronic memory.

Figure 3:
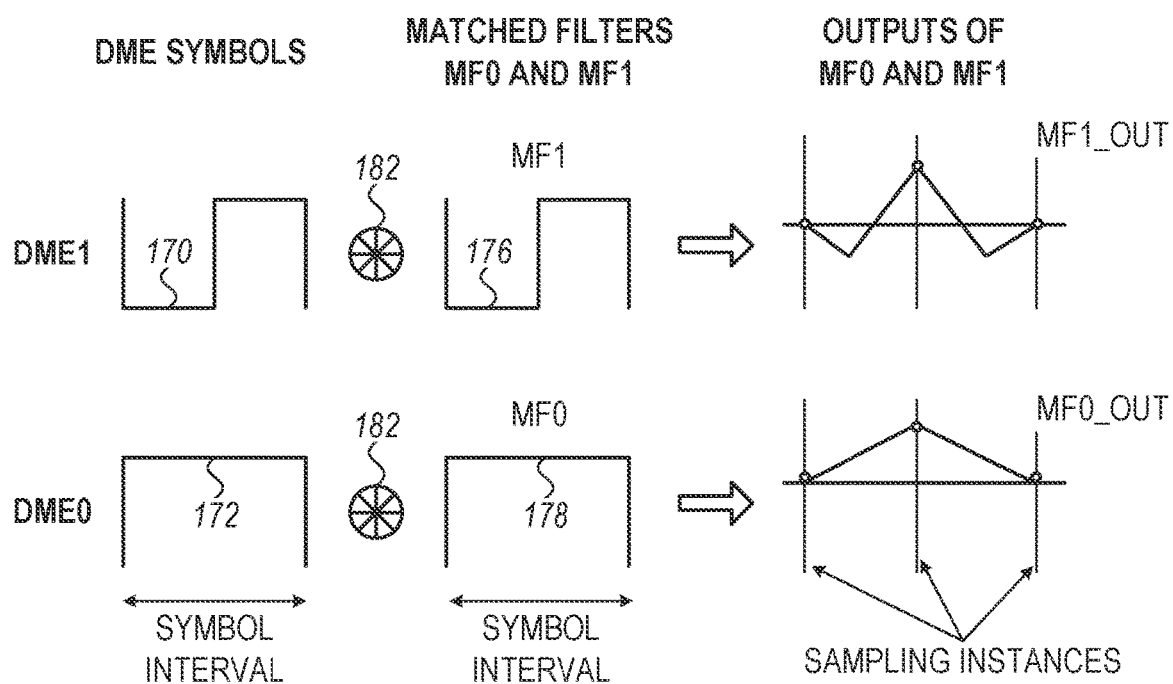
FIG. 3 is a diagram that schematically illustrates DME signals and corresponding matching filters and outputs, in accordance with an embodiment that is described herein.

FIG. 3 is a diagram that schematically illustrates DME signals and corresponding matching filters and outputs, in accordance with an embodiment that is described herein.

DME symbols denoted DME1 (170) and DME0 (172) correspond to data bits having '1' and '0' values, respectively. The DME1 and DME0 symbols may be used in producing an ideal DME signal comprising ideal DME symbols at the transmitter side. In practice, the transmitted ideal symbols are received distorted at the receiver, which degrades the receiver performance.

In the present example, the DME1 symbol has a level transition in the corresponding symbol interval, whereas the DME0 symbol has a constant level in the corresponding symbol interval. A matching filter denoted MF1 (176) is matched to the DME1 symbol and a matching filter denoted MF0 (178) is matched to the DME0 symbol. MF1 176 and MF0 178 may be used in implementing respective matching filters MF1 60 and MF0 58 of FIG. 2.

Digital processor 44 filters the DME signal by applying a convolution operation 182 between samples of the received DME signal and each of matching filters MF1 and MF0. In FIG. 3, MF1_OUT corresponds to filtering an ideal DME1 symbol using MF1, and MF0_OUT corresponds to filtering an ideal DME0 symbol using MF0. In both cases, the output of the matching filter at the relevant sampling instance is significantly high. It should be noted that filtering DME1 using MF0 and filtering DME0 using MF1 would produce a zero output level (or close to zero level) at the relevant sampling instances. Consequently, based on a difference signal calculated between absolute-value signals derived from the filtered signals, slicer 70 can distinguish between cases of matching a received DME symbol to MF1 or MF0.

In FIG. 3, the DME0 and DME1 symbols are depicted in certain polarities. In a DME signal that comprises a sequence of multiple DME symbols, the polarity of certain symbols may be inverted, e.g., for the sake of achieving Direct Current (DC) balance. For example, two consecutive DME0 symbols are assigned opposite respective polarities.

The matching filters MF0 and MF1 are depicted in FIG. 3 in certain polarities. In alternative embodiments, however, opposite polarities for MF0, MF1 or both can also be used.

It is noted that the DME1 and DME0 symbols in FIG. 3 are represented by ideal signals, e.g., ideal square wave signals in this example. In practice, the symbols undergo various distortion and interference that alter their shape, which translates to lowering the values at the outputs of relevant matching filters at the symbol sampling instances.

Figure 4:
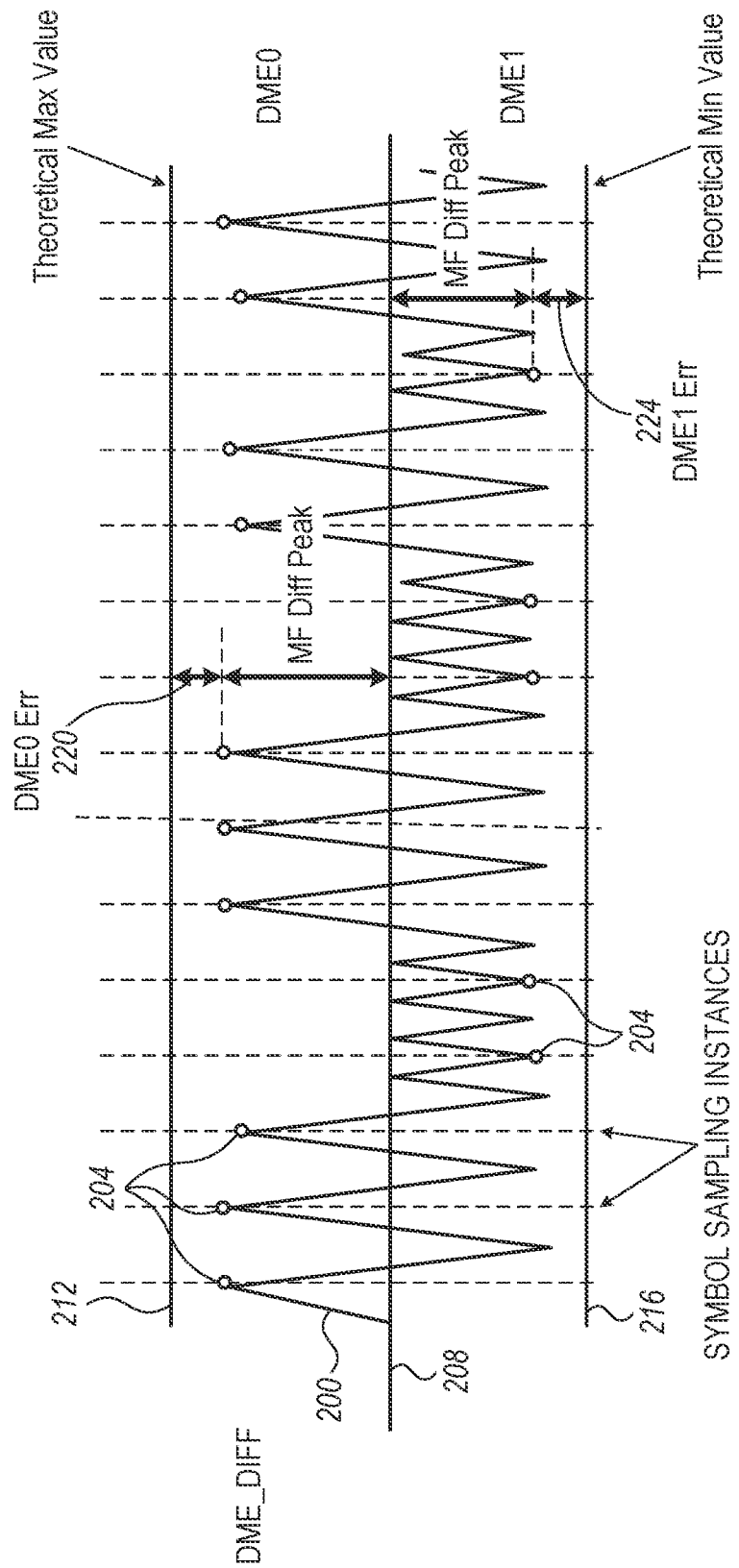
FIG. 4 is a diagram that schematically illustrates a difference signal used for deriving a DME error signal, in accordance with an embodiment that is described herein.

FIG. 4 is a diagram that schematically illustrates a difference signal used for deriving a DME error signal, in accordance with an embodiment that is described herein.

FIG. 4 depicts an example difference signal DME_DIFF 200 produced, e.g., by subtractor 66 of FIG. 1. Values 204 correspond to the values of the difference signal at the symbol sampling instances.

FIG. 4 depicts three horizontal lines, numbered 208, 212 and 216. Horizontal line 208 distinguishes between high-level samples that are associated with DME0 symbols and low-level samples that are associated with DME1 symbols. Line 212 is indicative of a maximal value achievable for ideal DME0 symbols. Similarly, line 216 is indicative of a minimal value achievable for ideal DME1 under ideal conditions.

In practice, due to various impairments such as an imperfect channel, interference, inaccurate sampling times and the like, the values of the DME_DIFF signal typically fall below line 212 for DME0 symbols and above line 216 for DME1 symbols. Optimal reception performance is theoretically achievable when the samples of the DME_DIFF signal reach lines 212 and 216. Moreover, as the difference (220) between values 204 of the difference signal (above line 208) and line 212 increases, the reception quality of the DME signal degrades. Similarly, the reception quality of the DME signal degrades as the difference (224) between values 204 (below line 208) and line 216 increases.

In some embodiments, error processor 74 produces the DME_ERR signal by calculating differences between samples of received signals of the DME0 and DME1 symbols at the sampling instances, and the maximal and minimal achievable values of line 212 and 216, respectively.

Figure 5:
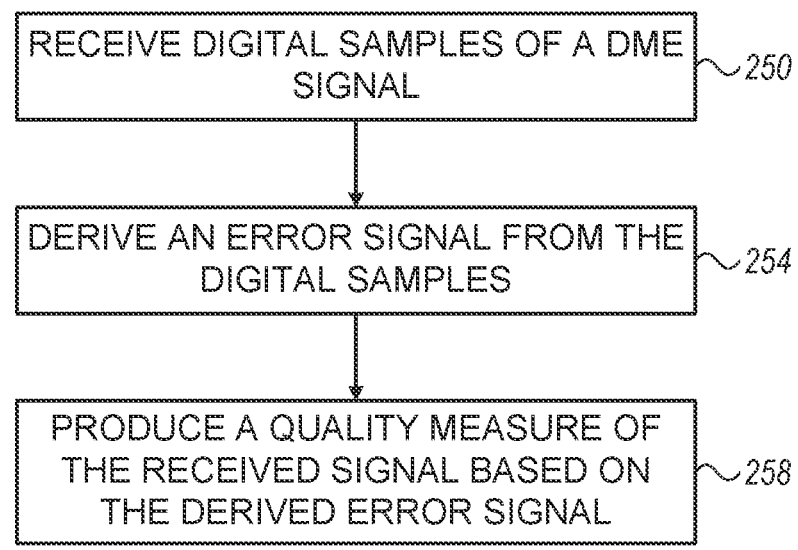
FIG. 5 is a flow chart that schematically illustrates a method for measuring the quality of a received DME signal, in accordance with an embodiment that is described herein.

FIG. 5 is a flow chart that schematically illustrates a method for measuring the quality of a received DME signal, in accordance with an embodiment that is described herein. The method will be described as executed by digital processor 44 of PHY device 32 of FIG. 1.

The method begins with digital processor 44 receiving digital samples of a DME signal, at a reception operation 250. In an embodiment, the DME signal is sampled and digitized by analog FE 46, as described in FIG. 1. In some embodiments, the received DME signal conforms to the 10BASE-T1S standard (IEEE 802.3cg-2019) cited above.

At an error signal derivation operation 254, the digital processor derives an error signal from the received digital samples of the DME signal. In an example embodiment, the digital processor derives the error signal by calculating differences between absolute-value signals of the outputs of the matching filters MF0 and MF1 to produce a DME_DIFF signal as described in FIG. 1. The digital processor calculates an error signal (e.g., the DME_ERR signal) as described in FIG. 4. Alternatively, any other suitable method for deriving the error signal can also be used.

At a quality monitoring operation 258, the digital processor produces a quality measure of the received DME signal based on the derived error signal. In a nonlimiting example embodiment, digital processor 44 produces the quality measure from the DME_DIFF signal using quality monitor 78 or 100. Following operation 258 the method terminates.

The embodiments above are given by way of example, and other suitable embodiments can also be used. For example, although the embodiments described above consider monitoring reception quality of a DME signal in a communication system based on the 10BASE-T1S standard, the embodiments are also applicable to other suitable communication systems that communicate DME signals.

Although the embodiments described herein mainly address the SQI measure feature required by the TC14 of the OPEN Alliance Inc for measuring reception quality of DME signals in accordance with the 10BASE-T1S standard, the methods and systems described herein can also be used in other applications, such as in communication systems adopting the IEEE 802.3cg, 802.3da or other protocols based on DME encoding.

It is noted that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. A receiver, comprising:
   an interface, configured to receive a signal comprising symbols carrying bit values in respective symbol intervals, and to convert the received signal into a serial sequence of digital samples, wherein the received signal being modulated using a Differential Manchester Encoding (DME) scheme that (i) represents a first bit value by a first symbol type having a level transition in the corresponding symbol interval and (ii) represents a second bit value by a second symbol type having a constant level in the corresponding symbol interval; and
   a processor, configured to:
   filter the digital samples by a first matching filter that is matched to the first symbol type and calculate absolute values of samples output by the first matching filter so as to produce a first absolute-value filtered signal;
   filter the digital samples by a second matching filter that is matched to the second symbol type and calculate absolute values of samples output by the second matching filter so as to produce a second absolute-value filtered signal;
   derive an error signal based on a difference signal calculated according to a difference between the first absolute-value filtered signal and the second absolute-value filtered signal; and
   produce a quality measure of the received signal based on the derived error signal.

2. The receiver according to claim 1, wherein the processor is configured to calculate the error signal for a given symbol interval by calculating a difference between a value of the difference signal for the given symbol interval and a maximal or minimal achievable value of the difference signal.

3. The receiver according to claim 1, wherein the interface is configured to receive the signal over a single-pair link in accordance with a 10BASE-T1S specification.

4. The receiver according to claim 1, wherein the interface is configured to receive the signal from an automotive communication network.

5. The receiver according to claim 1, wherein the processor is configured to calculate an absolute-value error signal from the error signal, to filter the absolute-value error signal for producing a filtered absolute-value error signal using a smoothing filter, and to convert the filtered absolute-value error signal into the quality measure.

6. The receiver according to claim 5, wherein the processor is configured to convert the filtered absolute-value error signal into the quality measure using a lookup table.

7. The receiver according to claim 5, wherein the quality measure is an average quality measure, and wherein the processor is configured to filter the absolute-value error signal using a Low Pass Filter (LPF).

8. The receiver according to claim 5, wherein the quality measure is a peak quality measure, and wherein the processor is configured to filter the absolute-value error signal by selecting peak values of the absolute-value error signal and averaging among the selected peak values.

9. A method for communication, comprising:
   receiving a signal comprising symbols carrying bit values in respective symbol intervals, and converting the received signal into a serial sequence of digital samples, wherein the received signal being modulated using a Differential Manchester Encoding (DME) scheme that (i) represents a first bit value by a first symbol type having a level transition in the corresponding symbol interval and (ii) represents a second bit value by a second symbol type having a constant level in the corresponding symbol interval;
   filtering the digital samples by a first matching filter that is matched to the first symbol type and calculating absolute values of samples output by the first matching filter so as to produce a first absolute-value filtered signal;
   filtering the digital samples by a second matching filter that is matched to the second symbol type and calculating absolute values of samples output by the second matching filter so as to produce a second absolute-value filtered signal;
   deriving an error signal based on a difference signal calculated according to a difference between the first absolute-value filtered signal and the second absolute-value filtered signal; and
   producing a quality measure of the received signal based on the derived error signal.

10. The method according to claim 9, wherein producing the error signal comprises calculating the error signal for a given symbol interval by calculating a difference between a value of the difference signal for the given symbol interval and a maximal or minimal achievable value of the difference signal.

11. The method according to claim 9, wherein receiving the signal comprises receiving the signal over a single-pair link in accordance with a 10BASE-T1S specification.

12. The method according to claim 9, wherein receiving the signal comprises receiving the signal from an automotive communication network.

13. The method according to claim 9, wherein the producing a quality measure comprises calculating an absolute-value error signal from the error signal, filtering the absolute-value error signal for producing a filtered absolute-value error signal using a smoothing filter, and converting the filtered absolute-value error signal into the quality measure.

14. The method according to claim 13, wherein converting the filtered absolute-value signal comprises converting the filtered absolute-value error signal into the quality measure using a lookup table.

15. The method according to claim 13, wherein the quality measure is an average quality measure, and wherein filtering the absolute-value error signal comprises filtering the absolute-value error signal using a Low Pass Filter (LPF).

16. The method according to claim 13, wherein the quality measure is a peak quality measure, and wherein filtering the absolute-value error signal comprises selecting peak values of the absolute-value error signal and averaging among the selected peak values.

17. A receiver, comprising:
an interface, configured to receive a signal comprising symbols carrying bit values in respective symbol intervals, and to convert the received signal into a serial sequence of digital samples, wherein the received signal being modulated using a Differential Manchester Encoding (DME) scheme that (i) represents a first bit value by a first symbol type having a level transition in the corresponding symbol interval and (ii) represents a second bit value by a second symbol type having a constant level in the corresponding symbol interval; and
a processor, configured to:
  derive an absolute-value error signal from the digital samples; and
  produce a peak quality measure of the received signal based on the derived error signal, by selecting peak values of the absolute-value error signal and averaging the selected peak values.

* * * * *